United States Patent
Ku (10) Patent No.: US 8,729,940 B2
(45) Date of Patent: May 20, 2014

(54) DELAY LOCKED LOOP CIRCUIT AND SEMICONDUCTOR DEVICE HAVING THE SAME

(75) Inventor: Young-Jun Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 59 days.

(21) Appl. No.: 12/975,886

(22) Filed: Dec. 22, 2010

(65) Prior Publication Data

US 2011/0291720 A1  Dec. 1, 2011

(30) Foreign Application Priority Data

May 31, 2010 (KR) .......................... 10-2010-0051085

(51) Int. Cl.
*H03L 7/06* (2006.01)

(52) U.S. Cl.
USPC ........... 327/158; 327/147; 327/149; 327/153; 327/161

(58) Field of Classification Search
USPC ...................... 327/141, 144–163; 331/15–17; 375/373–376
See application file for complete search history.

(56) References Cited

U.S. PATENT DOCUMENTS

| | | | |
|---|---|---|---|
| 7,997,986 B2 * | 8/2011 | Huang et al. .................... | 463/38 |
| 8,130,015 B2 * | 3/2012 | Miyano .......................... | 327/156 |
| 2004/0251936 A1 * | 12/2004 | Gomm .......................... | 327/141 |
| 2007/0182472 A1 * | 8/2007 | Cho ............................... | 327/175 |
| 2010/0123495 A1 * | 5/2010 | Kobayashi et al. ............ | 327/158 |
| 2010/0134155 A1 * | 6/2010 | Lee et al. ....................... | 327/143 |
| 2010/0156486 A1 * | 6/2010 | Yun et al. ...................... | 327/158 |
| 2010/0201413 A1 * | 8/2010 | Miyano ......................... | 327/158 |
| 2011/0227620 A1 * | 9/2011 | Lee ............................... | 327/158 |

FOREIGN PATENT DOCUMENTS

| | | |
|---|---|---|
| JP | 2008-028628 | 2/2008 |
| KR | 1020040037797 | 5/2004 |

OTHER PUBLICATIONS

Notice of Allowance issued by the Korean Intellectual Property Office on Mar. 26, 2012.

* cited by examiner

*Primary Examiner* — Brandon S Cole
(74) *Attorney, Agent, or Firm* — IP & T Group LLP (57) ABSTRACT

A semiconductor device includes a delay line configured to delay a source clock by a delay equal to a first number of delay units in response to a delay control code and to generate a delayed source clock; a delay amount sensing unit configured to sense whether the delay amount of the delay line reaches a delay amount limit; a clock cycle measuring unit configured to measure the cycle of the source clock by counting a sampling clock in response to an output signal of the delay amount sensing unit, wherein a cycle of the sampling clock is equal to a second number of delay units; and a delay amount controlling unit configured to change the delay amount of the delay line in response to the measured cycle of the source clock as determined from an output signal of the clock cycle measuring unit.

17 Claims, 5 Drawing Sheets

DELAY LOCKED LOOP CIRCUIT AND SEMICONDUCTOR DEVICE HAVING THE SAME

CROSS-REFERENCE(S) TO RELATED APPLICATIONS

The present application claims priority of Korean Patent Application No, 10-2010-0051085, filed on May 31, 2010, which is incorporated herein by reference in its entirety.

BACKGROUND OF THE INVENTION

Exemplary embodiments of the present invention relate to semiconductor design technology, and more particularly, to a circuit for delaying an input clock in a semiconductor device.

In general, data is to be inputted/outputted in synchronization with a reference clock in a synchronous semiconductor memory device such as a double data rate synchronous dynamic random access memory (DDR SDRAM) device.

Here, since the reference clock mainly represents an external clock CLK/CLKB inputted from an external device such as a memory controller, in order to transmit data that are time-synchronized with the reference clock, the synchronous semiconductor memory device is desired to output the data accurately at the edge or the center of a pulse of the external clock CLK/CLKB.

However, The external clock CLK/CLKB that is inputted into the semiconductor memory device are buffered through an input buffering circuit and used as an internal clock, and the phase of the internal clock is changed as the internal clock passes through all internal circuits (e.g., control circuits, peripheral circuits, and a cell array) of the semiconductor memory device. When the internal clock is transferred and used in an output buffering circuit, the internal clock may be asynchronous with the external clock CLK/CLKB.

At this time, if data are outputted from the semiconductor memory device in synchronization with the internal clock, the data may be outputted from the semiconductor memory device in non-synchronization with the external clock CLK/CLKB due to the phase difference between the internal clock and the external clock CLK/CLKB.

Therefore, in order to output data in time-synchronization with the phase of the external clock CLK/CLKB that is a reference clock in the semiconductor memory device, a delay time, by which the internal clock is delayed until the internal clock generated from the external clock CLK/CLKB is transmitted to an output pad is to be reversely compensated to the internal clock applied to the output pad to make the phase of the internal clock be synchronized with the phase of the external clock CLK/CLKB.

Typical examples of the circuit for synchronizing the phase of the internal clock with the phase of the external clock CLK/CLKB by compensating the time by which the phase of the internal clock is delayed as described above are a phase locked loop (PLL) circuit and a delay locked loop (DLL) circuit.

The PLL circuit is mainly used to simultaneously synchronize a frequency and a phase of the internal clock with those of the external clock using a frequency multiplication function when the frequency of the internal clock used in the semiconductor memory device becomes different from the frequency of the external clock inputted from an external device as a reference clock.

On the other hand, the DLL circuit is used to synchronize only a phase of the internal clock with that of the external clock when the frequency of the internal clock is the same as that of the external clock.

Although the PLL circuit has an additional function such as the frequency multiplication function compared to the DLL circuit as described above, the DLL circuit is practically used more widely than the PLL circuit in case of the semiconductor memory device. There are various reasons therefor. The representative reason is that the DLL circuit may be less sensitive about noise and occupy a smaller area than the PLL circuit.

Figure 1:
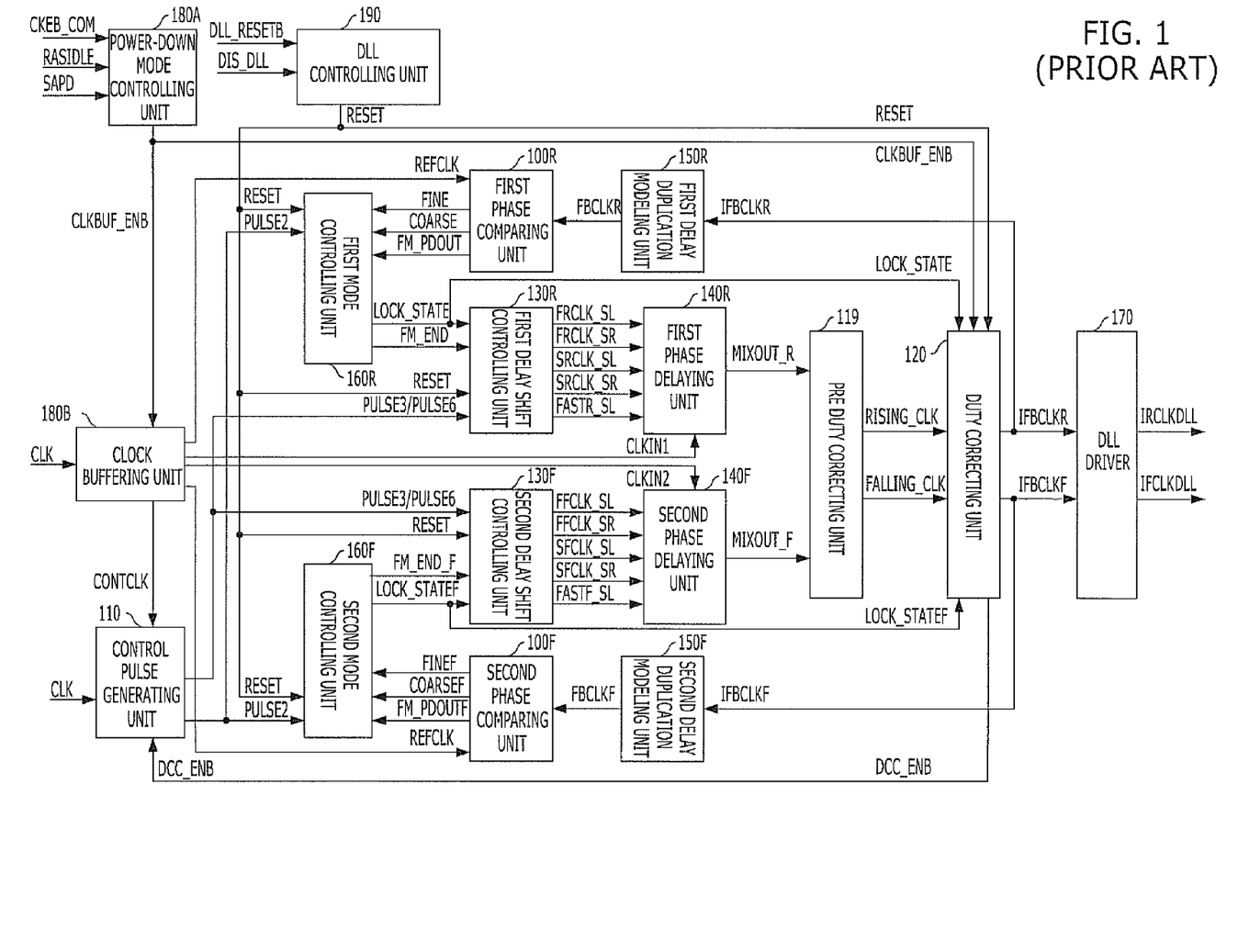
FIG. 1 is a block diagram illustrating a delay locked loop circuit provided in a general semiconductor device.

FIG. 1 is a block diagram illustrating a delay locked loop circuit provided in a general semiconductor device.

Referring to FIG. 1, a delay locked loop (DLL) circuit provided in a general semiconductor device includes: a phase comparing unit 100R/100F configured to compare the phase of a source clock REFCLK with the phase of a feedback clock FBCLKR/FBCLKF; a control pulse generating unit 110 configured to generate a plurality of control pulses PULSE2, PULSE3, and PULSE6 activated sequentially for delay shifting update periods in response to a control clock CONTCLK; a mode controlling unit 160R/160F configured to generate mode control signals FM_END, LOCK_STATE, FM_END_F, and LOCK_STATEF corresponding to the comparison results FINE, COARSE, FM_PDOUT, FINEF, COARSEF, and FM_PDOUTF of the phase comparing unit 100R/100F; a delay shift controlling unit 130R/130F configured to generate first delay shift control signals FRCLK_SL, FRCLK_SR, SRCLK_SL, SRCLK_SR, FFCLK_SL, FFCLK_SR, SFCLK_SL, and SFCLK_SR for controlling a delay shifting operation in a normal mode and a coarse mode and second delay shift control signals FASTR_SL and FASTF_SL for controlling the delay shifting operation in a fast mode in response to the mode control signals FM_END, LOCK_STATE, FM_END_F, and LOCK_STATEF; a phase delaying unit 140R/140F configured to delay-shift the phases of internal clocks CLKIN1 and CLKIN2 on a delay unit basis in response to the first delay shift control signals FRCLK_SL, FRCLK_SR, SRCLK_SL, SRCLK_SR, FFCLK_SL, FFCLK_SR, SFCLK_SL, and SFCLK_SR in the normal mode, delay-shift the phases of the internal clocks CLKIN1 and CLKIN2 on a unit (smaller than the delay unit) basis in response to the first delay shift control signals FRCLK_SL, FRCLK_SR, SRCLK_SL, SRCLK_SR, FFCLK_SL, FFCLK_SR, SFCLK_SL, and SFCLK_SR in the coarse mode, and delay-shift the phases of the internal clocks CLKIN1 and CLKIN2 on a delay group (including a plurality of delay units) basis in response to the second delay shift control signals FASTR_SL and FASTF_SL in the fast mode; a delay duplication modeling unit 150R/150F configured to delay an output clock IFBCLKR/IFBCLKF of a duty correcting unit 120 using a delay time in which the actual delay conditions of an internal clock path are reflected and output the feedback clock FBCLKR/FBCLKF; a clock buffering unit 180B configured to buffer an external clock CLK and generate the source clock REFCLK, control clock CONTCLK, and internal clocks CLKIN1 and CLKIN2, the phases of which are synchronized; a power-down mode controlling unit 180A configured to generate a clock buffer enable signal CLKBUF_ENB for controlling an operation of the clock buffering unit 180B in response to an inversion signal CKEB_COM of a clock enable signal, a signal SAPD with power-down mode information of a mode register set MRS, and a signal RASIDLE with precharge information; a DLL controlling unit 190 configured to generate a reset signal RESET for controlling an operation of the DLL circuit in response to a DLL disable signal DIS_DLL and a DLL reset signal DLL- _RESETB inputted from an external device of a semiconductor memory device; a pre duty correcting unit 119 configured to invert the phase of the output clock MIXOUT_R/MIXOUT_F (mainly MIXOUT_F) of the phase delay unit 140R/140F and output a rising internal clock RISING_CLK with a rising edge corresponding to the rising edge of the internal clocks CLKIN1 and CLKIN2 and a falling internal clock FALLING_CLK with a rising edge corresponding to the falling edge of the internal clocks CLKIN1 and CLKIN2; the duty correcting unit 120 configured to correct the duty cycle ratio of the output clocks RISING_CLK and FALLING_CLK of the pre duty correcting unit 119 in a locking state; and a DLL driver 170 configured to output DLL output clocks IRCLKDLL and IFCLKDLL, generated by driving the output clocks IFBCLKR and IFBCLKF of the duty correcting unit 120, to an output driver of the semiconductor memory device.

Hereinafter, an operation of the conventional DLL circuit will be described with reference to the configuration thereof.

The aforesaid register-controlled DLL circuit is a DLL circuit that operates in a dual-loop mode. The DLL circuit in the dual-loop mode performs a DLL operation by means of two clocks with opposite phases and performs a duty cycle ratio correction operation to make the duty cycle ratio of the final output clock be 50:50 when it becomes a locking state through the DLL operation.

That is, the DLL circuit in the dual-loop mode performs a DLL operation by using the rising internal clock RISING_CLK with a rising edge corresponding to the rising edge of the internal clocks CLKIN1 and CLKIN2 and the falling internal clock FALLING_CLK with a rising edge corresponding to the falling edge of the internal clocks CLKIN1 and CLKIN2.

Meanwhile, there is a single-loop mode that is contrary to the dual-loop mode. The DLL circuit in the single-loop mode performs a DLL operation by means of only one clock corresponding to the rising edge or the falling edge of the internal clocks CLKIN1 and CLKIN2 before performing a duty cycle ratio correction operation, and performs a duty cycle ratio correction operation when it becomes a locking state through the DLL operation.

Among the components of the CLL circuit, the mode controlling unit 160R/160F, the phase comparing unit 100R/100F, the delay shift controlling unit 130R/130F, the phase delaying unit 140R/140F, and the delay duplication modeling unit 150R/150F may be divided into the blocks 100R, 160R, 130R, 140R, and 150R for controlling the phase of the rising internal clock RISING_CLK and the blocks 100F, 160F, 130F, 140F, and 150F for controlling the phase of the falling internal clock FALLING_CLK, which have the same circuit configurations, respectively.

Here, the blocks 100R, 160R, 130R, 140R, and 150R control the phase of the rising internal clock RISING_CLK for the rising edge of the rising internal clock RISING_CLK to be synchronized with the rising edge of the source clock REFCLK, before the locking state and even after the locking state. This is to make a locking state before the locking state, and to compensate for the phase shift of the rising clock RISING_CLK due to the influence of the noise or the power supply voltage applied from an external device of the semiconductor device after the locking state.

The blocks 100F, 160F, 130F, 140F, and 150F controls the phase of the falling internal clock FALLING_CLK for the rising edge of the rising internal clock RISING_CLK to be synchronized with the rising edge of the source clock REFCLK before the locking state. After the locking state, only some (130F and 140F) of the blocks 100F, 160F, 130F, 140F, and 150F operate and the other blocks 100F, 160F, and 150F do not operate. This is to make a locking state before the locking state and to prevent the output of the DLL circuit driver 170 from being affected by the phase shift of the falling internal clock FALLING_CLK after the locking state.

For reference, in a general dual-mode register-controlled DLL circuit, the locking state means the state where the rising edge of the source clock REFCLK, the rising edge of the rising internal clock RISING_CLK, and the rising edge of the falling internal clock FALLING_CLK are all synchronized within a predetermined margin of error.

Figure 2:
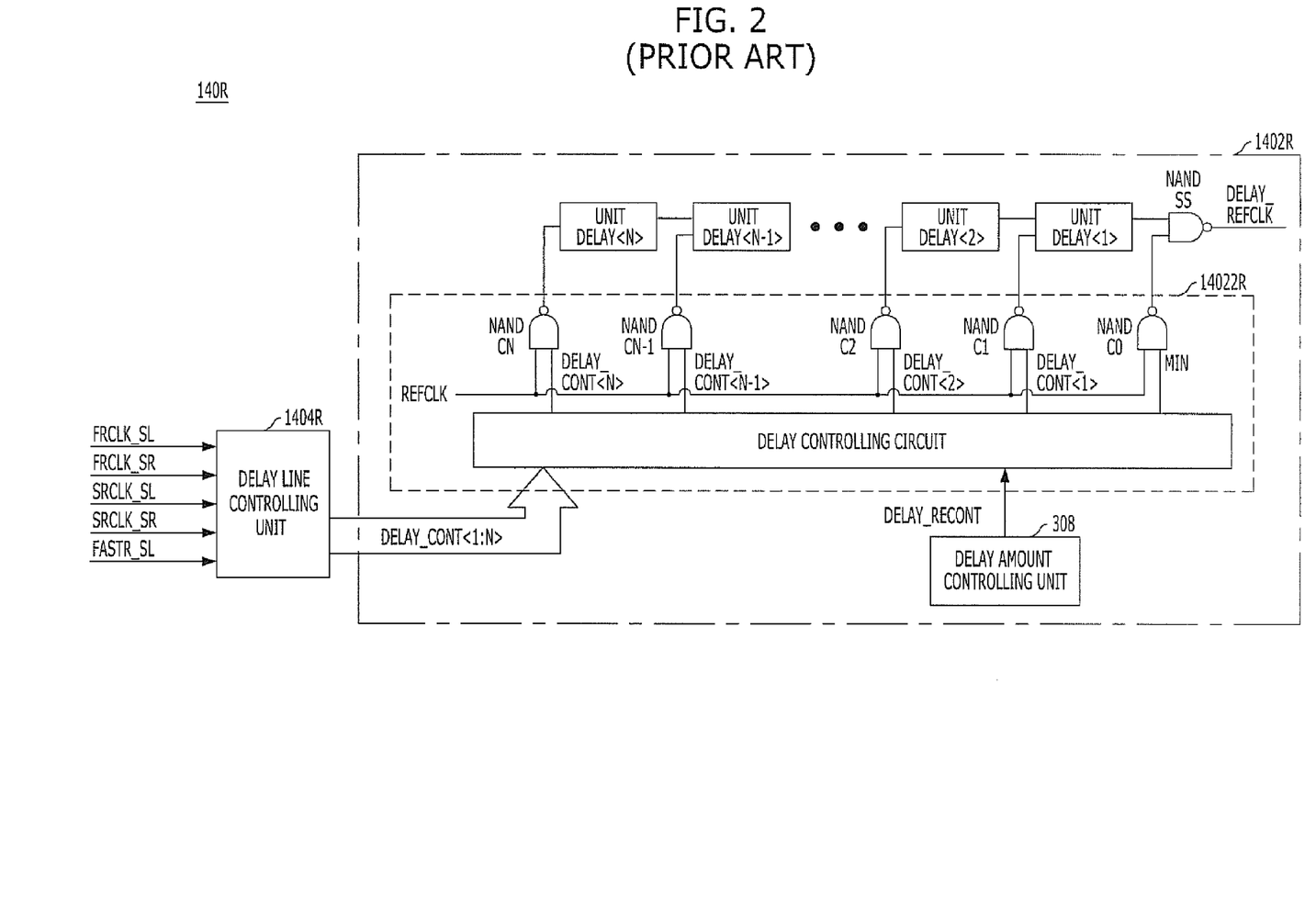
FIG. 2 is a circuit diagram illustrating a conventional phase delaying unit of the delay locked loop circuit provided in the general semiconductor device illustrated in FIG. 1.

FIG. 2 is a circuit diagram illustrating a conventional phase delaying unit of the delay locked loop circuit provided in the general semiconductor device illustrated in FIG. 1.

For reference, FIG. 2 illustrates the first phase delaying unit 140R of the phase delaying unit (140R/140F) in detail. Except the difference in the names of input/output signals, the detailed circuit configuration of the second phase delaying unit 140F is identical to the detailed circuit configuration of the first phase delaying unit 140R.

Referring to FIG. 2, the conventional phase delaying unit 140R of the delay locked loop circuit included in the conventional semiconductor device illustrated in FIG. 1 includes a delay line 1402R and a delay line controlling unit 1404R. The delay line 1402R is configured to delay a source clock REFCLK to generate a delay locked clock MIXOUT_R, wherein a delay amount of the delay line 1402R changes on a delay unit basis in response to a delay control code DELAY_CONT<1:N>. The delay line controlling unit 1404R is configured to generate the delay control code DELAY_CONT<1:N> in response to the first and second delay shift control signals FRCLK_SL, FRCLK_SR, SRCLK_SL, SRCLK_SR, and FASTR_SL received from the first delay shift controlling unit 130R.

Here, the delay line 1402R includes a plurality of delay units UNIT DELAY<1:N> and a delay controlling unit 14022R. The delay units UNIT DELAY<1:N> are connected in series. The delay controlling unit 14022R is configured to provide the source clock REFCLK to any one of the delay units UNIT DELAY<1:N> in response to the delay control code DELAY_CONT<1:N>.

Hereinafter, an operation of the first phase delaying unit 140R in the conventional DLL circuit will be described with reference to the configuration thereof.

When the delay amount of the delay line 1402R is determined to be increased according to the first and second delay shift control signals FRCLK_SL, FRCLK_SR, SRCLK_SL, SRCLK_SR, and FASTR_SL received from the first delay shift controlling unit 130R, the delay line controlling unit 1404R increases the value of the delay control code DELAY_CONT<1:N> and the number of delay units, through which the source clock REFCLK passes among the delay units UNIT DELAY<1:N> in the delay line 1402R, is increased accordingly, thus increasing the delay amount thereof.

For example, it is assumed that the delay control code DELAY_CONT<1:N> is an 8-bit signal DELAY_CONT<1:8> and the current value is '0 0 0 1 0 0 0 0'. In this case, if the delay amount of the delay line 1402R is determined to be increased by the first and second delay shift control signals FRCLK_SL, FRCLK_SR, SRCLK_SL, SRCLK_SR, and FASTR_SL, the value of the delay control code DELAY_CONT<1:N> may be increased to be '0 0 1 0 0 0 0 0', '0 1 0 0 0 0 0 0', and '1 0 0 0 0 0 0 0', sequentially. Accordingly, the number of delay lines, through which the source clock REFCLK passes among the delay units UNIT DELAY<1:N> in the delay line 1402R, is increased from 5 to 6, 7, and 8, sequentially, thus increasing the delay amount thereof.

On the other hand, when the delay amount of the delay line 1402R is determined to be decreased according to the first and second delay shift control signals FRCLK_SL, FRCLK_SR, SRCLK_SL, SRCLK_SR, and FASTR_SL received from the first delay shift controlling unit 130R, the delay line controlling unit 1404R decreases the value of the delay control code DELAY_CONT<1:N> and the number of delay lines, through which the source clock REFCLK passes among the delay units UNIT DELAY<1:N> in the delay line 1402R, is decreased accordingly, thus decreasing the delay amount thereof.

For example, it is assumed that the delay control code DELAY_CONT<1:N> is an 8-bit signal DELAY_CONT<1:8> and the current value is '0 0 0 1 0 0 0 0'. In this case, if the delay amount of the delay line 1402R is determined to be decreased by the first and second delay shift control signals FRCLK_SL, FRCLK_SR, SRCLK_SL, SRCLK_SR, and FASTR_SL, the value of the delay control code DELAY_CONT<1:N> may be decreased to become '0 0 0 0 1 0 0 0', '0 0 0 0 0 1 0 0', '0 0 0 0 0 0 1 0', and '0 0 0 0 0 0 0 1', sequentially. Accordingly, the number of delay lines, through which the source clock REFCLK passes among the delay units UNIT DELAY<1:N> in the delay line 1402R, is decreased from 5 to 4, 3, 2, and 1, sequentially, thus decreasing the delay amount thereof.

However, in the configuration of the first phase delaying unit 140R of the general DLL circuit in the semiconductor device, a maximum delay amount thereof is predetermined, and a DLL operation fail may occur if the locking operation of the DLL circuit cannot be completed even using all of the delay amount.

Therefore, in the configuration of the first phase delaying unit 140R of the conventional DLL circuit in the semiconductor device, it is important to determine the degree of the predetermined delay amount.

The reason for this is that if the delay amount is determined to be too small, a DLL operation fail may occur, thus causing the malfunction of the semiconductor device.

On the other hand, if the delay amount is determined to be too large, it occupies a large area and causes much jitter in the delay locked clock MIXOUT_R, thus increasing the probability that other internal circuits using the delay locked clock MIXOUT_R may perform abnormal operations.

SUMMARY OF THE INVENTION

An embodiment of the present invention is directed to a circuit for logically changing the delay amount of a delay locked loop circuit of a semiconductor device.

In accordance with an exemplary embodiment of the present invention, a semiconductor device includes: a delay line configured to delay a source clock by a delay equal to a first number of delay units in response to a delay control code and to generate a delayed source clock; a delay amount sensing unit configured to sense whether the delay amount of the delay line reaches the delay amount limit; a clock cycle measuring unit configured to measure the cycle of the source clock on a sampling unit basis in response to an output signal of the delay amount sensing unit, wherein the sampling unit is determined according to the delaying unit; and a delay amount controlling unit configured to change the delay amount of the delay line in response to the measured cycle of the source clock as determined from an output signal of the clock cycle measuring unit.

In accordance with another exemplary embodiment of the present invention, a delay locked loop circuit of a semiconductor device includes: a phase comparing unit configured to compare the phase of a source clock with the phase of a feedback clock to generate a delay control code according to the comparison result; a delay line configured to delay the source clock to output a delay locked clock, wherein a delay amount of the delay line changes by a delay equal to a first number of delay units in response to the delay control code and the delay amount of the delay line changes, when the delay amount of the delay line reaches a delay amount limit, in response to a cycle of the source clock; and a delay duplication modeling unit configured to output the feedback clock by delaying the delay locked clock for a delay time reflecting delay conditions of the source clock inside the semiconductor device.

In accordance with further exemplary embodiment of the present invention, a semiconductor device includes: a delay line configured to delay a source clock using a plurality of delay units selected in response to a delay control code; a delay amount sensing unit configured to generate a maximum delay amount sense signal when all of the delay units are selected and generate a minimum delay amount sense signal when a single one of the delay units is selected; a clock cycle measuring unit configured to measure the cycle of the source clock by counting a sampling clock in response to the maximum and minimum delay amount sense signals, wherein a cycle of the sampling clock is equal to a number of delay units; and a delay amount controlling unit configured to change the delay control code in response to an output signal of the clock cycle measuring unit.

As described above, when the delay amount of the phase delaying circuit included in the semiconductor device reaches the delay amount limit, the present invention logically changes the delay amount of the phase delaying circuit by the degree corresponding to one cycle of the source clock, thereby increasing/decreasing the delay amount of the phase delaying circuit regardless of the physical size.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
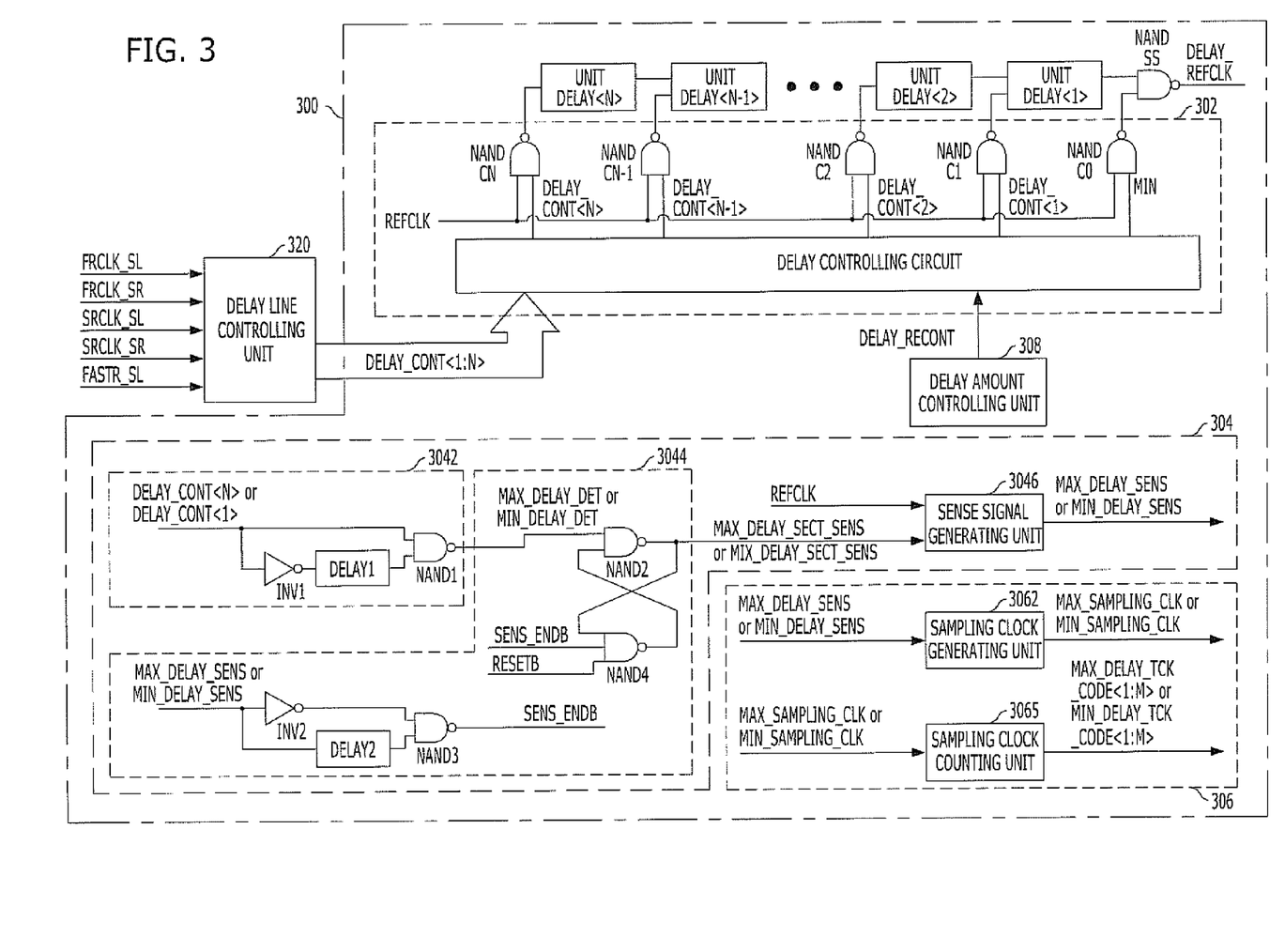
FIG. 3 is a circuit diagram illustrating a clock phase delaying unit of a delay locked loop circuit in accordance with an exemplary embodiment of the present invention.
Figure 4A:
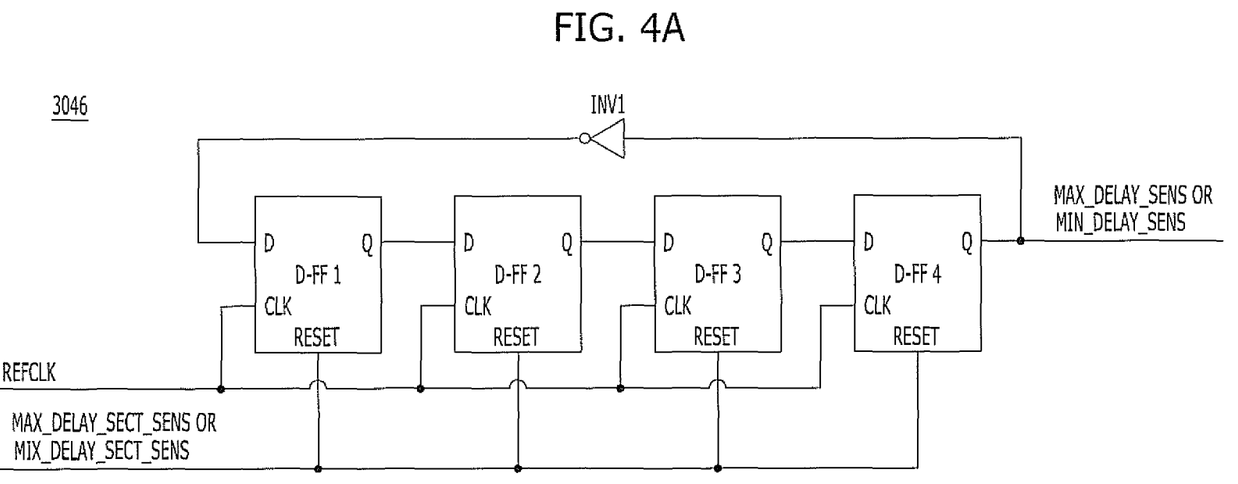
FIG. 4A is a circuit diagram illustrating a sense signal generating unit of the clock phase delaying unit illustrated in FIG. 3, in accordance with an exemplary embodiment of the present invention.
Figure 4B:
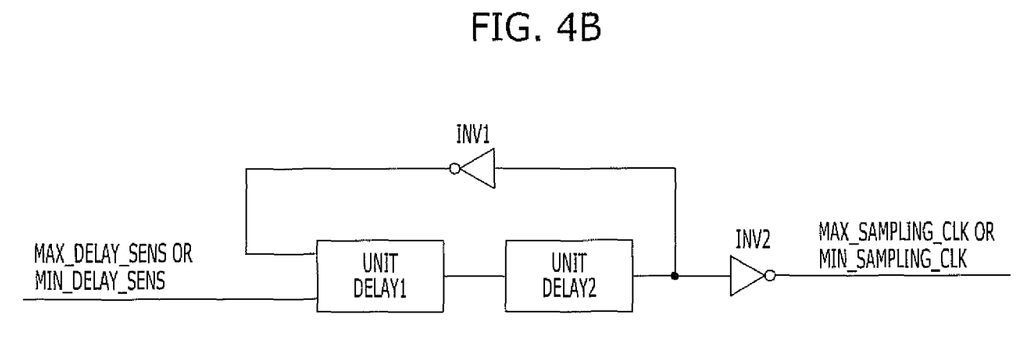
FIG. 4B is a circuit diagram illustrating a sampling clock generating unit of the clock phase delaying unit illustrated in FIG. 3, in accordance with an exemplary embodiment of the present invention.

FIG. 3 is a circuit diagram illustrating a clock phase delaying unit of a delay locked loop circuit in accordance with an exemplary embodiment of the present invention. FIG. 4A is a circuit diagram illustrating a sense signal generating unit of the clock phase delaying unit illustrated in FIG. 3, in accordance with an exemplary embodiment of the present invention. FIG. 4B is a circuit diagram illustrating a sampling clock generating unit of the clock phase delaying unit illustrated in FIG. 3, in accordance with an exemplary embodiment of the present invention. For reference, the clock phase delaying unit of FIG. 3 may be applied to the semiconductor device of FIG. 1 by replacing the phase delay unit 140R/140F.

Referring to FIG. 3, the clock phase delaying unit of the delay locked loop circuit in accordance with an exemplary embodiment of the present invention includes a delay line 300 and a delay line controlling unit 320. The delay line 300 is configured to delay a source clock REFCLK to output a delayed source clock DELAY_REFCLK, wherein a delay amount of the delay line 300 changes on a delay unit basis in response to a delay control code DELAY_CONT<1:N>, and the delay amount of the delay line 300 changes by the degree corresponding to one cycle of the source clock REFCLK when the delay amount of the delay line 300 reaches the delay amount limit. The delay line controlling unit 320 is configured to generate the delay control code DELAY_CONT<1:N> in response to first and second delay shift control signal FRCLK_SL, FRCLK_SR, SRCLK_SL, SRCLK_SR, and FASTR_SL received from a first delay shift controlling unit 130R.

Here, the delay line 300 may have any one of the following three configurations according to the circuit design.

As the first configuration, the delay line 300 includes a plurality of delay units UNIT DELAY<1:N>, a delay controlling unit 302, a maximum delay amount sensing unit 304, a clock cycle measuring unit 306, and a delay amount controlling unit 308. The delay units UNIT DELAY<1:N> are connected in series. The delay controlling unit 302 is configured to provide the source clock REFCLK to any one of the delay units UNIT DELAY<1:N> in response to the delay control code DELAY_CONT<1:N>. The maximum delay amount sensing unit 304 is configured to generate a maximum delay amount sense signal MAX_DELAY_SENS in response to the providing of the source dock REFCLK to the last one UNIT DELAY<N> of the delay units UNIT DELAY<1:N>. The clock cycle measuring unit 306 is configured to measure the cycle of the source clock REFCLK on a sampling unit basis in response to the maximum delay amount sense signal MAX_DELAY_SENS, wherein the sampling unit is determined according to the delay unit. The delay amount controlling unit 308 is configured to decrease the delay amount of the delay line 300 by the degree corresponding to one cycle (1tck) of the source clock REFCLK in response to an output signal MAX_DELAY_TCK_CODE<1:M> of the clock cycle measuring unit 306.

Here, the maximum delay amount sensing unit 304 includes an activation detecting unit 3042, a sense period signal generating unit 3044, and a sense signal generating unit 3046. The activation detecting unit 3042 is configured to detect the activation of the bit value DELAY_CONT<N> of the delay control code DELAY_CONT<1:N> for controlling the providing of the source clock REFCLK to the last one UNIT DELAY<N> of the delay units UNIT DELAY<1:N>. The sense period signal generating unit 3044 is configured to generate a sense period signal MAX_DELAY_SECT_SENS that is activated in response to an output signal MAX_DELAY_DET of the activation detecting unit 3042 and is deactivated in response to the deactivation of the maximum delay amount sense signal MAX_DELAY_SENS. The sense signal generating unit 3046 is configured to generate the maximum delay amount sense signal MAX_DELAY_SENS that is activated in synchronization with the source clock REFCLK in response to the activation of the sense period signal MAX_DELAY_SECT_SENS and is deactivated in response to the predetermined number of togglings of the source clock REFCLK.

The activation detecting unit 3042 of the maximum delay amount sensing unit 304 includes an inverter INV1, a delay unit DELAY1, and a NAND gate NAND1. The inverter INV1 and the delay unit DELAY1 are configured to receive the bit value DELAY_CONT<N> of the delay control code DELAY_ CONT<1:N> for controlling the providing of the source clock REFCLK to the last one UNIT DELAY<N> of the delay units UNIT DELAY<1:N>, invert the phase thereof, and delay the inverted signal by a predetermined time. The NAND gate NAND1 is configured to perform a logical NAND operation on the bit value DELAY_CONT<N> and the signal outputted through the inverter INV1 and the delay unit DELAY1.

The sense period signal generating unit 3044 of the maximum delay amount sensing unit 304 includes a set-reset (SR) latch, an inverter INV2, a delay unit DELAY2, and a NAND gate NAND3. The SR latch includes two NAND gates NAND2 and NAND4 configured to receive an output signal MAX_DELAY_DET of the activation detecting unit 3042 through a set input terminal, receives a reset signal RESETB and a sensing end signal SENS_ENDB through a reset input terminal, and generate the sense period signal MAX_DELAY_SECT_SENS. The inverter INV2 is configured to invert the phase of the maximum delay amount sense signal MAX_DELAY_SENS. The delay unit DELAY2 is configured to delay the maximum delay amount sense signal MAX_DELAY_SENS by a predetermined time. The NAND gate NAND 3 is configured to perform a logical NAND operation on an output signal of the inverter INV2 and an output signal of the delay unit DELAY2 to output the sensing end signal SENS_ENDB.

Referring to FIG. 4A, the sense signal generating unit 3046 of the maximum delay amount sensing unit 304 includes a plurality of D flip-flops D-FF1, D-FF2, D-FF3, and D-FF4 and an inverter INV1. The D flip-flops D-FF1, D-FF2, D-FF3, and D-FF4 are connected in series to receive the sense period signal MAX_DELAY_SECT_SENS through a reset input terminal, receive the source clock REFCLK through a clock input terminal CLK, and output the maximum delay amount sense signal MAX_DELAY_SENS through the final terminal. The inverter INV1 is configured to invert the phase of the maximum delay amount sense signal MAX_DELAY_SENS and transmit the resulting signal to a start terminal of the D flip-flops D-FF1, D-FF2, D-FF3, and D-FF4.

Accordingly, the maximum delay amount sensing unit 304 activates the maximum delay amount sense signal MAX_DELAY_SENS in response to the activation of the bit value DELAY_CONT<N> of the delay control code DELAY_CONT<1:N> for controlling the providing of the source clock REFCLK to the last one UNIT DELAY<N> of the delay units UNIT DELAY<1:N>, and deactivates the maximum delay amount sense signal MAX_DELAY_SENS after a predetermined time that corresponds to the predetermined number of the cycles of the source clock REFCLK.

For reference, the sense signal generating unit 3046 of the maximum delay amount sensing unit 304 illustrated in FIG. 4A includes four D flip-flops D-FF1, D-FF2, D-FF3, and D-FF4. This means that the maximum delay amount sense signal MAX_DELAY_SENS is activated while the cycle of the source clock REFCLK is repeated four times. However, the present invention is not limited thereto. That is, the sense signal generating unit 3046 may include less than four D flip-flops or may include more than four D flip-flops. In an exemplary embodiment of the present invention, the reason for activating the maximum delay amount sense signal MAX_DELAY_SENS during the four cycles of the source clock REFCLK (rather than during the one cycle of the source clock REFCLK) is to measure the cycle of the source clock REFCLK more accurately.

The clock cycle measuring unit 306 includes a sampling clock generating unit 3062 and a sampling clock counting unit 3064. The sampling clock generating unit 3062 is configured to generate a maximum delay amount sampling clock MAX_SAMPLING_CLK that toggles on a sampling unit basis, starts the toggling in response to the activation of the maximum delay amount sense signal MAX_DELAY_SENS, and ends the toggling in response to the deactivation of the maximum delay amount sense signal MAX_DELAY_SENS. The sampling clock counting unit 3064 is configured to count the number of times of toggling of the maximum delay amount sampling clock MAX_SAMPLING_CLK to determine the value of a maximum delay amount clock cycle measurement code MAX_DELAY_TCK_CODE<1:M>.

Referring to FIG. 4B, the sampling clock generating unit 3062 of the clock cycle measuring unit 306 includes first and second inverters INV1 and INV2 and delay units UNIT DELAY1 and UNIT DELAY2 configured to perform an oscillating operation in response to the maximum delay amount sense signal MAX_DELAY_SENS and generate the maximum delay amount sampling clock MAX_SAMPLING_CLK.

For reference, because the sampling clock generating unit 3062 illustrated in FIG. 4B uses two delay units UNIT DELAY1 and UNIT DELAY2 for an oscillating operation, the cycle of the generated sampling clock MAX_SAMPLING_CLK has a length corresponding to the delay amount of the four delay units.

That is, the generated sampling clock MAX_SAMPLING_ CLK has the cycle corresponding to the delay units. Here, since the generated sampling clock MAX_SAMPLING_CLK toggles while the maximum delay amount sense signal MAX_DELAY_SENS is activated, i.e., during the four cycles of the source clock REFCLK as described in FIG. 4A, the value of counting one cycle of the source clock REFCLK on a delay unit basis can be obtained by diving the number of toggling of the sampling clock MAX_SAMPLING_CLK by 4.

Accordingly, the clock cycle measuring unit 306 counts the number of times of toggling of the sampling clock MAX_SAMPLING_CLK which toggles on a sampling unit basis, in the period of maintaining the activation state of the maximum delay amount sense signal MAX_DELAY_SENS, and determines the value of the maximum delay amount clock cycle measurement code MAX_DELAY_TCK_CODE<1:M> according to the toggling count number.

The delay amount controlling unit 308 changes the value of the delay control code DELAY_CONT<1:N> according to the value of the maximum delay amount clock cycle measurement code MAX_DELAY_TCK_CODE<1:M>, thereby controlling the delay controlling unit 302 to provide the source clock REFCLK to the delay unit that precedes the last one UNIT DELAY<N> of the delay units UNIT DELAY<1: N> by the delay units corresponding to one cycle of the source clock REFCLK.

As the second configuration, the delay line 300 includes a plurality of delay units UNIT DELAY<1:N>, a delay controlling unit 302, a minimum delay amount sensing unit 304, a clock cycle measuring unit 306, and a delay amount controlling unit 308. The delay units UNIT DELAY<1:N> are connected in series. The delay controlling unit 302 is configured to provide the source clock REFCLK to any one of the delay units UNIT DELAY<1:N> in response to the delay control code DELAY_CONT<1:N>. The minimum delay amount sensing unit 304 is configured to generate a minimum delay amount sense signal MIN_DELAY_SENS in response to the providing of the source clock REFCLK to the first one UNIT DELAY<1> of the delay units UNIT DELAY<1:N>. The clock cycle measuring unit 306 is configured to measure the cycle of the source clock REFCLK on a sampling unit basis in response to the minimum delay amount sense signal MIN_DELAY_SENS, wherein the sampling unit is determined according to the delay unit. The delay amount controlling unit 308 is configured to increase the delay amount of the delay line 300 by the degree corresponding to one cycle (1tck) of the source clock REFCLK in response to an output signal MIN_DELAY_REFCLK_TCK_CODE of the clock cycle measuring unit 306.

Here, the minimum delay amount sensing unit 304 includes an activation detecting unit 3042, a sense period signal generating unit 3044, and a sense signal generating unit 3046. The activation detecting unit 3042 is configured to detect the activation of the bit value DELAY_CONT<1> of the delay control code DELAY_CONT<1:N> for controlling the providing of the source clock REFCLK to the first one UNIT DELAY<1> of the delay units UNIT DELAY<1:N>. The sense period signal generating unit 3044 is configured to generate a sense period signal MIN_DELAY_SECT_SENS that is activated in response to an output signal MIN_DELAY_DET of the activation detecting unit 3042 and is deactivated in response to the deactivation of the minimum delay amount sense signal MIN_DELAY_SENS. The sense signal generating unit 3046 is configured to generate the minimum delay amount sense signal MIN_DELAY_SENS that is activated in synchronization with the source clock REFCLK in response to the activation of the sense period signal MIN_DELAY_SECT_SENS and is deactivated in response to the predetermined number of toggling of the source clock REFCLK.

The activation detecting unit 3042 of the minimum delay amount sensing unit 304 includes an inverter INV1, a delay unit DELAY1, and a NAND gate NAND1. The inverter INV1 and the delay unit DELAY1 are configured to receive the bit value DELAY_CONT<1> of the delay control code DELAY_ CONT<1:N> for controlling the providing of the source clock REFCLK to the first one UNIT DELAY<1> of the delay units UNIT DELAY<1:N>, invert the phase thereof, and delay the inverted signal by a predetermined time. The NAND gate NAND1 is configured to perform a logical NAND operation on the bit value DELAY_CONT<1> and the signal outputted through the inverter INV1 and the delay unit DELAY1.

The sense period signal generating unit 3044 of the minimum delay amount sensing unit 304 includes a set-reset (SR) latch, an inverter INV2, a delay unit DELAY2, and a NAND gate NAND3. The SR latch includes two NAND gates NAND2 and NAND4 configured to receive an output signal MIN_DELAY_DET of the activation detecting unit 3042 through a set input terminal, receives a reset signal RESETB and a sensing end signal SENS_ENDB through a reset input terminal, and generate the sense period signal MIN_DELAY_ SECT_SENS. The inverter INV2 is configured to invert the phase of the minimum delay amount sense signal MIN_DELAY_SENS. The delay unit DELAY2 is configured to delay the minimum delay amount sense signal MIN_DELAY_SENS by a predetermined time. The NAND gate NAND 3 is configured to perform a logical NAND operation on an output signal of the inverter INV2 and an output signal of the delay unit DELAY2 to output the sensing end signal SENS_ENDB.

Referring to FIG. 4A, the sense signal generating unit 3046 of the minimum delay amount sensing unit 304 includes a plurality of D flip-flops D-FF1, D-FF2, D-FF3, and D-FF4 and an inverter INV1. The D flip-flops D-FF1, D-FF2, D-FF3, and D-FF4 are connected in series to receive the sense period signal MIN_DELAY_SECT_SENS through a reset input terminal, receive the source clock REFCLK through a clock input terminal CLK, and output the minimum delay amount sense signal MIN_DELAY_SENS through the final terminal. The inverter INV1 is configured to invert the phase of the minimum delay amount sense signal MIN_DELAY_SENS and transmit the resulting signal to a start terminal of the D flip-flops D-FF1, D-FF2, D-FF3, and D-FF4.

Accordingly, the minimum delay amount sensing unit 304 activates the minimum delay amount sense signal MIN_DELAY_SENS in response to the activation of the bit value DELAY_CONT<1> of the delay control code DELAY_CONT<1:N> for controlling the providing of the source clock REFCLK to the first one UNIT DELAY<1> of the delay units UNIT DELAY<1:N>, and deactivates the minimum delay amount sense signal MIN_DELAY_SENS after a predetermined time that corresponds to the predetermined number of the cycles of the source clock REFCLK.

For reference, the sense signal generating unit 3046 of the minimum delay amount sensing unit 304 illustrated in FIG. 4A includes four D flip-flops D-FF1, D-FF2, D-FF3, and D-FF4. This means that the minimum delay amount sense signal MIN_DELAY_SENS is activated while the cycle of the source clock REFCLK is repeated four times. However, the present invention is not limited thereto. That is, the m sense signal generating unit 3046 may include less than four D flip-flops or may include more than four D flip-flops. In an exemplary embodiment of the present invention, the reason for activating the minimum delay amount sense signal MIN_DELAY_SENS during the four cycles of the source clock REFCLK (rather than during the one cycle of the source clock REFCLK) is to measure the cycle of the source clock REFCLK more accurately.

The clock cycle measuring unit 306 includes a sampling clock generating unit 3062 and a sampling clock counting unit 3064. The sampling clock generating unit 3062 is configured to generate a minimum delay amount sampling clock MIN_SAMPLING_CLK that toggles on a sampling unit basis, starts the toggling in response to the activation of the minimum delay amount sense signal MIN_DELAY_SENS, and ends the toggling in response to the deactivation of the minimum delay amount sense signal MIN_DELAY_SENS. The sampling clock counting unit 3064 is configured to count the number of times of toggling of the minimum delay amount sampling clock MIN_SAMPLING_CLK to determine the value of a minimum delay amount clock cycle measurement code MIN_DELAY_REFCLK_TCK_CODE.

Referring to FIG. 4B, the sampling clock generating unit 3062 of the clock cycle measuring unit 306 includes first and second inverters INV1 and INV2 and delay units UNIT DELAY1 and UNIT DELAY2 configured to perform an oscillating operation in response to the minimum delay amount sense signal MIN_DELAY_SENS and generate the minimum delay amount sampling clock MIN_SAMPLING_CLK.

For reference, because the sampling clock generating unit 3062 illustrated in FIG. 4B uses two delay units UNIT DELAY1 and UNIT DELAY2 for an oscillating operation, the cycle of the generated sampling clock MIN_SAMPLING_CLK has a length corresponding to the delay amount of the four delay units.

That is, the generated sampling clock MIN_SAMPLING_CLK has the cycle corresponding to the delay units. Here, since the generated sampling clock MIN_SAMPLING_CLK toggles while the minimum delay amount sense signal MIN_DELAY_SENS is activated, i.e., during the four cycles of the source clock REFCLK as described in FIG. 4A, the value of counting one cycle of the source clock REFCLK on a delay unit basis can be obtained by diving the number of toggling of the sampling clock MIN_SAMPLING_CLK by 4.

Accordingly, the clock cycle measuring unit 306 counts the number of times of toggling of the sampling clock MIN_SAMPLING_CLK, which toggles on a sampling unit basis, in the period of maintaining the activation state of the minimum delay amount sense signal MIN_DELAY_SENS, and determines the value of the minimum delay amount clock cycle measurement code MIN_DELAY_REFCLK_TCK_CODE according to the toggling count number.

The delay amount controlling unit 308 changes the value of the delay control code DELAY_CONT<1:N> according to the value of the minimum delay amount clock cycle measurement code MIN_DELAY_REFCLK_TCK_CODE, thereby controlling the delay controlling unit 302 to provide the source clock REFCLK to the delay unit that follows the first one UNIT DELAY<1> of the delay units UNIT DELAY<1:N> by the delay units corresponding to one cycle of the source clock REFCLK.

As the first configuration, the delay line 300 includes a plurality of delay units UNIT DELAY<1:N>, a delay controlling unit 302, a maximum delay amount sensing unit 304A, a minimum delay amount sensing unit 304B, a maximum delay amount clock cycle measuring unit 306A, a minimum delay amount clock cycle measuring unit 306B, a maximum delay amount controlling unit 308A, and a minimum delay amount controlling unit 308B. The delay units UNIT DELAY<1:N> are connected in series. The delay controlling unit 302 is configured to provide the source clock REFCLK to any one of the delay units UNIT DELAY<1:N> in response to the delay control code DELAY_CONT<1:N>. The maximum delay amount sensing unit 304A configured to generate a maximum delay amount sense signal MAX_DELAY_SENS in response to the providing of the source clock REFCLK to the last one UNIT DELAY<N> of the delay units UNIT DELAY<1:N>. The minimum delay amount sensing unit 304B is configured to generate a minimum delay amount sense signal MIN_DELAY_SENS in response to the providing of the source clock REFCLK to the first one UNIT DELAY<1> of the delay units UNIT DELAY<1:N>. The maximum delay amount clock cycle measuring unit 306A is configured to measure the cycle of the source clock REFCLK on a sampling unit basis in response to the maximum delay amount sense signal MAX_DELAY_SENS, wherein the sampling unit is determined according to the delay unit. The minimum delay amount clock cycle measuring unit 306B is configured to measure the cycle of the source clock REFCLK on a sampling unit basis in response to the minimum delay amount sense signal MIN_DELAY_SENS, wherein the sampling unit is determined according to the delay unit. The maximum delay amount controlling unit 308A is configured to decrease the delay amount of the delay line 300 by the degree corresponding to one cycle (1tck) of the source clock REFCLK in response to an output signal MAX_DELAY_TCK_CODE<1:M> of the maximum delay amount clock cycle measuring unit 306A. The minimum delay amount controlling unit 308B is configured to increase the delay amount of the delay line 300 by the degree corresponding to one cycle (1tck) of the source clock REFCLK in response to an output signal MIN_DELAY_REFCLK_TCK_CODE of the minimum delay amount clock cycle measuring unit 306B.

It can be understood that the third configuration of the delay line 300 is a combination of the first configuration of the delay line 300 and the second configuration of the delay line 300.

Hereinafter, an operation of the clock phase delaying unit having the above configuration will be described in accordance with an exemplary embodiment of the present invention.

Figure 5:
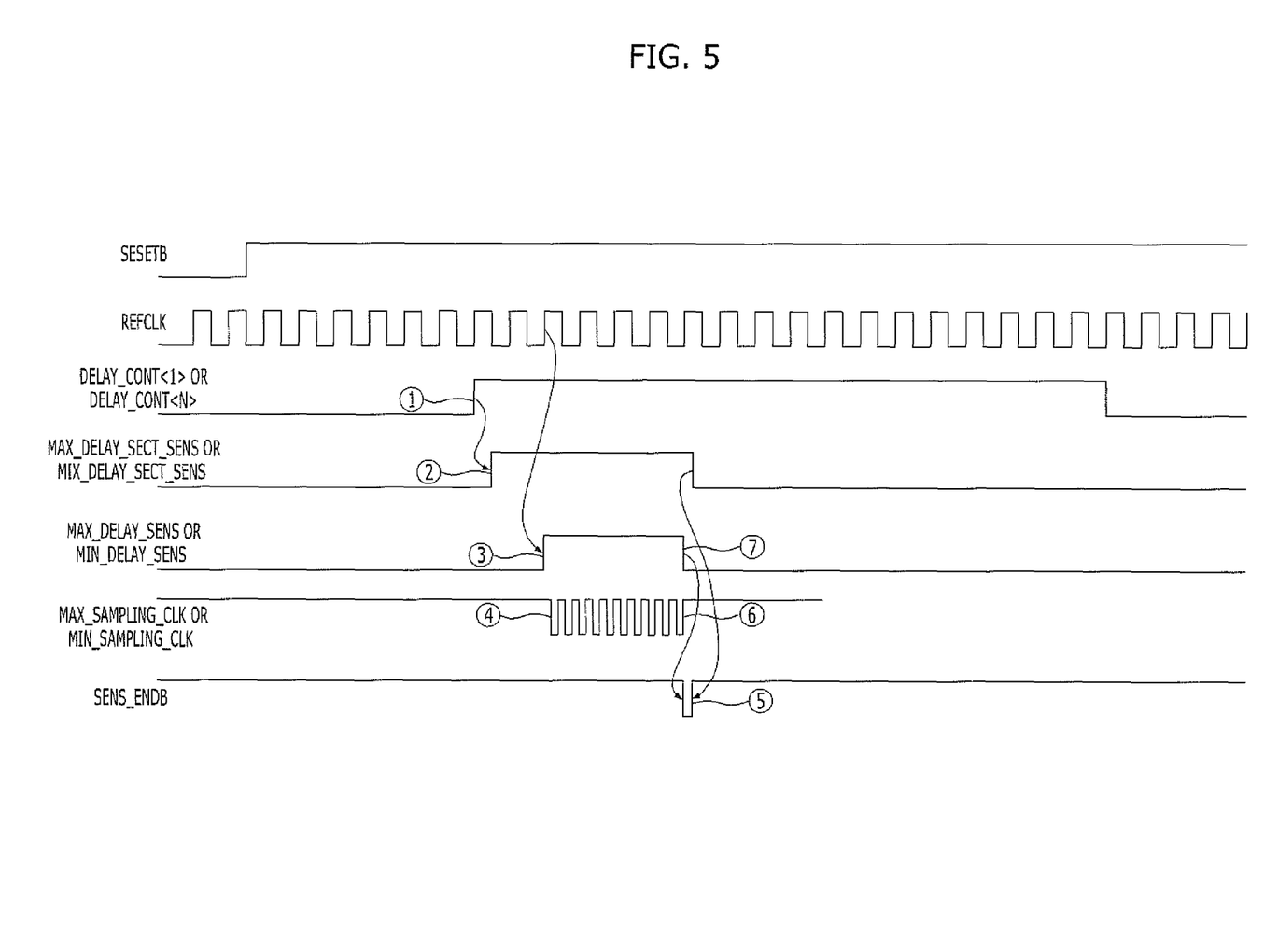
FIG. 5 is a timing diagram illustrating an operation of the clock phase delaying unit illustrated in FIG. 3, in accordance with an exemplary embodiment of the present invention.

FIG. 5 is a timing diagram illustrating an operation of the clock phase delaying unit illustrated in FIG. 3, in accordance with an exemplary embodiment of the present invention.

Referring to FIG. 5, the clock phase delaying unit in accordance with an exemplary embodiment of the present invention starts to operate when the bit value DELAY_CONT<N> of the delay control code DELAY_CONT<1:N> for providing the source clock REFCLK to the last one UNIT DELAY<N> of the delay units UNIT DELAY<1:N> or the bit value DELAY_CONT<1> of the delay control code DELAY_CONT<1:N> for providing the source clock REFCLK to the first one UNIT DELAY<1> of the delay units UNIT DELAY<1:N> is activated (①).

When the bit value DELAY_CONT<1> or the bit value DELAY_CONT<N> is activated (①), the sense period signal, i.e., a maximum delay amount sense period signal MAX_DELAY_SECT_SENS or a minimum delay amount sense period signal MIN_DELAY_SECT_SENS, is activated (②).

While the maximum delay amount sense period signal MAX_DELAY_SECT_SENS or the minimum delay amount sense period signal MIN_DELAY_SECT_SENS maintains an activation state, the maximum delay amount sense signal MAX_DELAY_SENS or the minimum delay amount sense signal MIN_DELAY_SENS is activated in synchronization with the source clock REFCLK (③).

When the maximum delay amount sense signal MAX_DELAY_SENS or the minimum delay amount sense signal MIN_DELAY_SENS is activated, the sampling clock, i.e., a maximum delay amount sampling clock MAX_SAMPLING_CLK or a minimum delay amount sampling clock MIN_SAMPLING_CLK, starts toggling. When the maximum delay amount sense signal MAX_DELAY_SENS or the minimum delay amount sense signal MIN_DELAY_SENS is deactivated, the maximum delay amount sampling clock MAX_SAMPLING_CLK or the minimum delay amount sampling clock MIN_SAMPLING_CLK ends toggling.

When the maximum delay amount sense signal MAX_DELAY_SENS or the minimum delay amount sense signal MIN_DELAY_SENS is deactivated, the sensing end signal SENS_ENDB toggles (be pulsed) in response thereto. The maximum delay amount sense period signal MAX_DELAY_SECT_SENS or the minimum delay amount sense period signal MIN_DELAY_SECT_SENS is deactivated in response to the toggling (pulsing) of the sensing end signal SENS_ENDB.

The number of times of the maximum delay amount sampling clock MAX_SAMPLING_CLK or the minimum delay amount sampling clock MIN_SAMPLING_CLK toggling during the period of maintaining the activation state of the maximum delay amount sense signal MAX_DELAY_SENS or the minimum delay amount sense signal MIN_DELAY_SENS is counted, and value of the maximum delay amount clock cycle measurement code MAX_DELAY_TCK_CODE<1:M> or the minimum delay amount clock cycle measurement code MIN_DELAY_TCK_CODE<1:M> is determined according to the counted number. The maximum delay amount clock cycle measurement code MAX_DELAY_TCK_CODE<1:M> or the minimum delay amount clock cycle measurement code MIN_DELAY_TCK_CODE<1:M> is used to determine to which number of delay unit preceding the last one UNIT DELAY<N> of the delay units UNIT DELAY<1:N> receives the source clock REFCLK through the delay amount controlling unit 308, or to which number of delay unit following the first UNIT DELAY<1> of the delay units UNIT DELAY<1:N> receives the source clock REFCLK through the delay amount controlling unit 308.

For example, it is assumed that the value of the maximum delay amount clock cycle measurement code MAX_DELAY_TCK_CODE<1:M> or the minimum delay amount clock cycle measurement code MIN_DELAY_TCK_CODE<1:M>, which is determined according to the toggling number of the maximum delay amount sampling clock MAX_SAMPLING_CLK or the minimum delay amount sampling clock MIN_SAMPLING_CLK counted during the period of maintaining the activation state of the maximum delay amount sense signal MAX_DELAY_SENS or the minimum delay amount sense signal MIN_DELAY_SENS, indicates '6'. In this case, the delay amount of the six delay units corresponds to one cycle of the source clock REFCLK. Therefore, the delay amount controlling unit 308 generates a control signal DELAY_RECONT and controls the delay controlling unit 302 to transmit the source clock REFCLK to the sixth one UNIT DELAY<N-6> preceding the last one UNIT DELAY<N> of the delay units UNIT DELAY<1:N> or the sixth one UNIT DELAY<7> following the first one UNIT DELAY<1> of the delay units UNIT DELAY<1: N>.

As described above, when the delay amount of the clock phase delaying circuit included in the semiconductor device reaches the delay amount limit, the present invention logically changes the transmission path of the source clock REFCLK provided to the delay line included in the clock phase delaying circuit, thereby logically increasing/decreasing the delay amount of the clock phase delaying circuit by the degree corresponding to one cycle of the source clock. Accordingly, the delay amount of the clock phase delaying circuit may be increased/decreased regardless of the physical size.

Therefore, the present invention can prevent the occurrence of a delay locked loop operation fail even when minimizing the physical/actual delay amount of the clock phase delaying circuit included in the delay locked loop circuit of the semiconductor device.

Also, the present invention can minimize the jitter in the delayed source clock MIXOUT_R because it can minimize the physical/actual delay amount of the clock phase delaying circuit included in the delay locked loop circuit of the semiconductor device.

Although it has been described that the exemplary embodiments of the present invention are applied to the delay locked loop circuit included in the semiconductor device, the exemplary embodiments of the present invention may be applicable not only to the delay locked loop circuit but also to any circuit that delays a source clock to output a delayed source clock.

In addition, the positions and types of the logic gates and transistors used herein may be differently implemented depending on polarities of the input signals.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a delay line configured to delay a source clock by a delay equal to a first number of delay units in response to a delay control code and to generate a delayed source clock, the delay line including a plurality of delay units connected in series;
   a delay amount sensing unit configured to sense whether the delay amount of the delay line reaches a delay amount limit, wherein the delay amount limit includes a maximum delay amount or a minimum delay amount;
   a clock cycle measuring unit configured to measure the cycle of the source clock by counting a sampling clock in response to an output signal of the delay amount sensing unit, wherein a cycle of the sampling clock is equal to a second number of delay units; and
   a delay amount controlling unit configured to change the delay amount of the delay line by a predetermined cycle of the source clock in response to an output signal of the clock cycle measuring unit,
   wherein the delay amount sensing unit is further configured to:
      activate a minimum delay amount sense signal in response to a bit value of the delay control code for the first delay unit, of the plurality of delay units in connected in series, and
      deactivate the minimum delay amount sense signal after the predetermined cycles of the source clock.

2. The semiconductor device of claim 1, wherein the predetermined cycle of the source clock is one cycle of the source clock.

3. The semiconductor device of claim 2, wherein the delay line further comprises:
   a delay controlling unit configured to provide the source clock to a delay unit of the delay units in response to the delay control code.

4. The semiconductor device of claim 3, wherein the delay amount sensing unit activates a maximum delay amount sense signal in response to the bit value of the delay control code for the last of the delay units in series and deactivates the maximum delay amount sense signal after predetermined cycles of the source clock.

5. The semiconductor device of claim 4, wherein the sampling clock includes a maximum delay amount sampling clock and the clock cycle measuring unit counts the maximum delay amount sampling clock during the activation period of the maximum delay amount sense signal and generates a maximum delay amount clock cycle measurement code in response to the counting of the maximum delay amount sampling clock.

6. The semiconductor device of claim 5, wherein the delay amount controlling unit changes the bit value of the delay control code according to the value of the maximum delay amount clock cycle measurement code to control the delay controlling unit to provide the source clock to the delay unit that precedes the last of the delay units in series by a number of the delay units corresponding to one cycle of the source clock.

7. The semiconductor device of claim 4, wherein the delay amount sensing unit comprises:
   an activation detecting unit configured to detect the activation of the bit value of the delay control code;
   a sense period signal generating unit configured to generate a sense period signal that is activated in response to an output signal of the activation detecting unit and is deactivated in response to the deactivation of the maximum delay amount sense signal; and
   a sense signal generating unit configured to generate the maximum delay amount sense signal that is activated in synchronization with the source clock in response to the sense period signal and is deactivated in response to a predetermined number of togglings of the source clock.

8. The semiconductor device of claim 7, wherein the clock cycle measuring unit comprises:
   a sampling clock generating unit configured to generate the sampling clock in response to the activation of the maximum delay amount sense signal and end the sampling clock in response to the deactivation of the maximum delay amount sense signal; and
   a sampling clock counting unit configured to count the number of times of togglings of the sampling clock to generate a maximum delay amount clock cycle measurement code.

9. The semiconductor device of claim 1, wherein the sampling clock includes a minimum delay amount sampling clock and the clock cycle measuring unit counts the minimum delay amount sampling clock during the activation period of the minimum delay amount sense signal and generates a minimum delay amount clock cycle measurement code in response to the counting of the minimum delay amount sampling clock.

10. The semiconductor device of claim 9, wherein the delay amount controlling unit changes the bit value of the delay control code according to the value of the minimum delay amount clock cycle measurement code, to control the delay controlling unit to provide the source clock to the delay unit that follows the first of the delay units in series by a number of the delay units corresponding to one cycle of the source clock.

11. A delay locked loop circuit of a semiconductor device, the delay locked loop circuit comprising:
   a phase comparing unit configured to compare the phase of a source clock with the phase of a feedback clock to generate a delay control code according to the comparison result;
   a delay line configured to delay the source clock to output a delay locked clock, wherein a delay amount of the delay line changes by a delay equal to a first number of delay units in response to the delay control code and the delay amount of the delay line is changed by a predetermined cycle of the source clock, when the delay amount of the delay line reaches a delay amount limit, wherein the delay amount limit includes a maximum delay amount or a minimum delay amount; and
   a delay duplication modeling unit configured to output the feedback clock by delaying the delay locked clock for a delay time reflecting delay conditions of the source clock inside the semiconductor device,
   wherein the delay comprises:
      a plurality of delay units connected in series;
      a delay controlling unit configured to provide the source clock to any one of the delay units in response to the delay control code;
      a maximum delay amount sensing unit configured to generate a maximum delay amount sense signal in response to the providing of the source clock to the last delay unit, of the plurality of delay units connected in series, or a minimum delay amount sensing unit configured to generate a minimum delay amount sense signal in response to the providing of the source clock to the first of the plurality of delay units connected in series;

a maximum delay amount clock cycle measuring unit configured to measure the cycle of the source clock on a sampling unit basis in response to the maximum delay amount sense signal, or a minimum delay amount clock cycle measuring unit configured to measure the cycle of the source clock on a sampling unit basis in response to the minimum delay amount sense signal, wherein the sampling unit corresponds to the delay unit; and a maximum delay amount controlling unit configured to decrease the delay amount of the delay line by the degree corresponding to one cycle of the source clock in response to an output signal of the maximum delay amount clock cycle measuring unit, or a minimum delay amount controlling unit configured to increase the delay amount of the delay line by the degree corresponding to one cycle of the source clock in response to an output signal of the minimum delay amount clock cycle measuring unit.

12. The delay locked loop circuit of claim 11, wherein the predetermined cycle of the source clock is one cycle of the source clock.

13. The delay locked loop circuit of claim 12, wherein the phase comparing unit increases the value of the delay control code if the phase of the feedback clock lags behind the phase of the source clock by more than a predetermined amount, decreases the value of the delay control code if the phase of the feedback clock leads the phase of the source clock by more than the predetermined amount, and maintains the value of the delay control code if the phase difference between the source clock and the feedback clock is within the predetermined amount.

14. The delay locked loop circuit of claim 13, wherein the delay line increases the delay amount in response to the increase of the value of the delay control code, and decreases the delay amount in response to the decrease of the value of the delay control code.

15. The delay locked loop circuit of claim 14, wherein the delay line decreases the value of the delay control code by a value corresponding to the one cycle of the source clock in response to the sensing of reaching a maximum delay amount, and increases the value of the delay control code by the value corresponding to the one cycle of the source clock in response to the sensing of reaching a minimum delay amount.

16. A semiconductor device comprising:

a delay line configured to delay a source clock using a plurality of delay units selected in response to a delay control code;

a delay amount sensing unit configured to generate a maximum delay amount sense signal when all of the delay units are selected and generate a minimum delay amount sense signal when a single one of the delay units is selected;

a clock cycle measuring unit configured to measure the cycle of the source clock by counting a sampling clock in response to the maximum and minimum delay amount sense signals, wherein a cycle of the sampling clock is equal to a number of delay units; and a delay amount controlling unit configured to change the delay control code to change the delay amount of the delay line by one cycle of the source clock in response to an output signal of the clock cycle measuring unit, wherein the maximum delay amount sense signal represents that a delay amount of the delay line reaches a maximum delay amount, and the minimum delay amount sense signal represents that the delay amount of the delay line reaches a minimum delay amount.

17. The semiconductor device of claim 16, wherein, when the minimum delay amount sense signal is generated, the delay line delays the source clock by selecting additional delay units having a combined delay equal to the cycle of the source clock in outputting the delayed source clock, and when the maximum delay amount sense signal is generated, the delay line delays the source clock by unselecting previously selected delay units having a combined delay equal to the cycle of the source clock in outputting the delayed source clock.

* * * * *